United States Patent [19]

Fridman

[11] Patent Number: 4,820,966
[45] Date of Patent: Apr. 11, 1989

[54] BATTERY MONITORING SYSTEM

[76] Inventor: Ron Fridman, 7540 E. Cochise, Scottsdale, Ariz. 85258

[21] Appl. No.: 205,633

[22] Filed: Jun. 13, 1988

[51] Int. Cl.⁴ .................. H02J 7/04; G01N 27/46
[52] U.S. Cl. .......................... 320/32; 320/43; 320/44; 320/48; 324/434; 340/636
[58] Field of Search ............... 320/13, 31, 32, 43, 320/44, 48; 340/52 F, 636; 324/434

[56] References Cited

U.S. PATENT DOCUMENTS

| | | | |
|---|---|---|---|
| 3,735,234 | 5/1973 | Godard | 320/44 |
| 4,140,996 | 2/1979 | Leitch et al. | 340/52 F |
| 4,194,146 | 3/1980 | Patry et al. | 320/44 |
| 4,258,306 | 3/1981 | Bourke et al. | 320/48 |
| 4,380,726 | 4/1983 | Sado et al. | 320/13 X |
| 4,484,140 | 11/1984 | Dieu | 320/43 X |
| 4,558,281 | 12/1985 | Codd et al. | 324/433 |
| 4,583,036 | 4/1986 | Morishita et al. | 320/29 |
| 4,724,528 | 2/1988 | Eaton | 320/43 X |

Primary Examiner—R. J. Hickey
Attorney, Agent, or Firm—Warren F. B. Lindsley

[57]  ABSTRACT

A diagnostic device for monitoring charging and discharging currents of a storage battery employing a current sensing resistor (shunt) adapted to be connected in series with a battery, the voltage and its polarity across the resistor being proportional to charging and discharging current through the battery and the direction of its flow. Amplifiers are employed for selectively amplifying charging and discharging currents with voltage to frequency converters providing trains of pulses responsive thereto which are compared by a microprocessor with stored programs for interpretation.

7 Claims, 3 Drawing Sheets

BATTERY MONITORING SYSTEM

BACKGROUND OF THE INVENTION

Electrical power systems on land and water supported vehicles such as recreational vehicles, campers, yachts and other large marine craft are quite complex. They typically comprise numerous storage batteries and associated charging devices, including alternators, solar panels, log generators and charge control circuits therefor.

These electrical power systems are vitally important to the operation of the vehicles, and failure of the systems at an inopportune time can result in inconvenience at the least, and in other instances, may result in life endangering situations.

Because the operators of such vehicles are commonly unfamiliar with the equipment and its maintenance requirements, and also because attention is typically directed more toward the pleasure of the trip and/or cruise, entertainment of the passengers, etc. than toward equipment maintenance, the care and proper control of the electrical system is often neglected until a problem arises.

The present invention is directed toward the provision of an automatic monitoring and control system that assures maintenance of the system in accordance with the best procedures known for the achievement of optimum performance and equipment life, and provides appropriate warning systems for the avoidance of inconvenient or threatening situations that might otherwise arise.

DESCRIPTION OF THE PRIOR ART

U.S. Pat. No. 4,558,281 discloses a microprocessor based power supply monitor having a display and a state of charge calculating capability. The microcomputer receives signals representing battery temperature, total battery voltage and battery current and calculates the charge withdrawn from the battery by integrating battery current and also calculates the remaining charge in the battery as a function of battery voltage. By running the remaining charge and the charge withdrawn, the present charge storage capacity value of the battery is calculated.

U.S. Pat. No. 4,583,036 discloses a diagnostic system for a charging system including a microcomputer made integral with a generator and which receives and processes data from plural points in the system to diagnose system faults. Various sensors such as current detectors and a battery electrolyte testing sensor may be used to input data to the microcomputer for processing.

U.S. Pat. No. 4,258,306 discloses an indicator circuit for indicating to the operator of an electrically propelled vehicle the remaining capacity of the vehicle battery. The circuit is arranged to prevent an increase in the indicated state of charge during use of the battery as a power source. This circuit is further arranged to prevent a decrease in the indication of the state of charge during a recharging of the battery.

U.S. Pat. No. 4,194,146 discloses a digital power supply monitor employing up-down counters for determining the state of charge of a storage battery.

None of these devices disclose the claimed invention.

SUMMARY OF THE INVENTION

In accordance with the invention claimed, a new and improved device for monitoring charging and discharging currents simultaneously of a storage battery means and its controls is disclosed which employs a current sensing resistor (shunt) adapted to be connected in series with the battery means, the voltage and its polarity across the battery means being proportional to charging and discharging current through the battery means and the direction of its flow.

First and second amplifier means are empoyed, one for indicating only discharge current flow through the battery means, and the other for indicating only charging current through the battery means. Voltage to frequency converters connected to the amplifier means provide trains of pulses which are received by a microprocessor which compares the pulses with stored programs for interpretation purposes.

It is, therefore, an object of this invention to provide a new and improved battery monitoring system.

Another object of this invention is to provide a new and improved battery state of charge evaluator.

A further object of this invention is to provide a new and improved state of charge evaluator for a battery means employing means for generating trains of pulses representative of charging and discharging currents through the battery means and comparing them with predetermined algorithms in microcomputer stored programs for interpretation.

A still further object of this invention is to provide a simple microprocess controlled system monitor for direct current batteries, particularly useful for marine and recreational vehicles and UPS (uninterrupted power supply) for computer back-up system.

BRIEF DESCRIPTION OF THE DRAWINGS

The present invention may be more readily described with reference to the accompanying drawings, in which.

DESCRIPTION OF THE PREFERRED EMBODIMENT

Figure 1A:
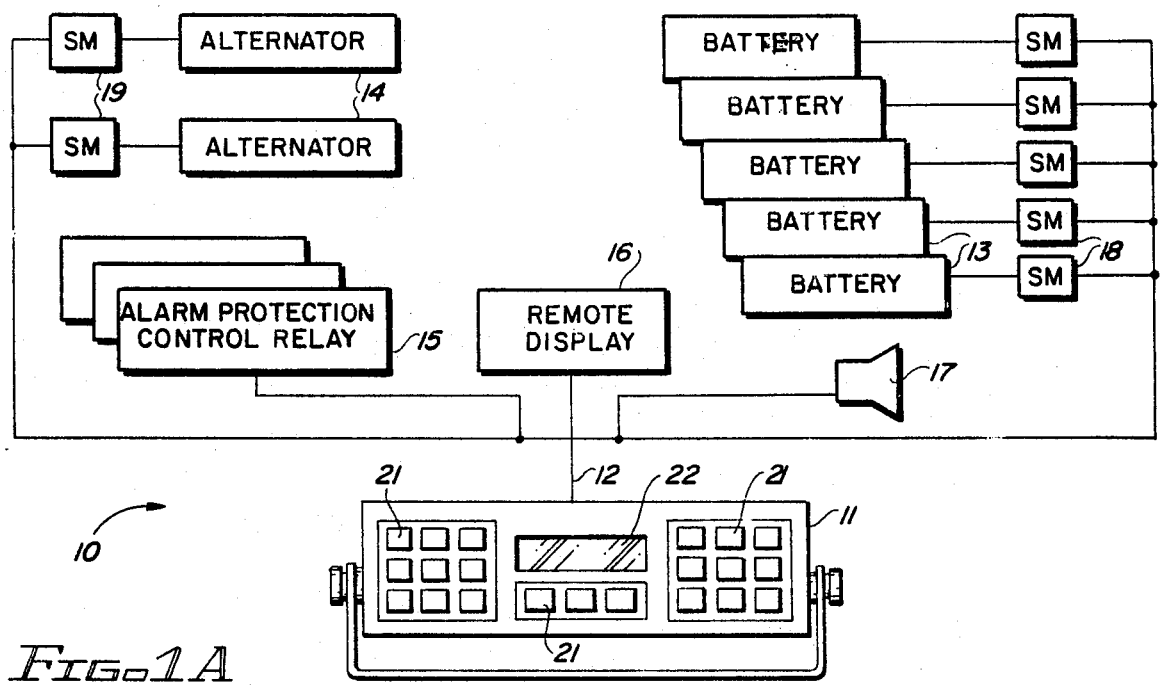
FIG. 1A is a functional drawing of an electrical system and its several individual elements controlled by a system embodying the invention.

Referring more particularly to the drawings by characters of reference, FIG. 1A discloses an automatic monitoring and control system 10 embodying the invention and comprising a central control unit 11 connected by means of a single control line or micro-bus 12 to various elements of the electrical system being monitored and controlled. As indicated, the electrical system typically comprises a number of batteries 13, and one or more alternators or charging devices 14 which serve as energy sources for charging the batteries. Elements of the control and monitoring system remote from central control unit 11 include alarm and protection control relays 15, remote displays 16, remote alarms 17, remote battery sensing modules 18 and remote alternator or charging device sensing modules 19.

Central control unit 11 employs a microprocessor together with various electronic memories and other control devices to address and communicate with the remote elements of the system. It also has a keyboard 21 that is employed as a means for interrogating the system to learn the status of the individual elements of the electrical system being monitored. The central control unit 12 responds to such interrogation by displayig information on electronic display panel 22.

Figure 1B:
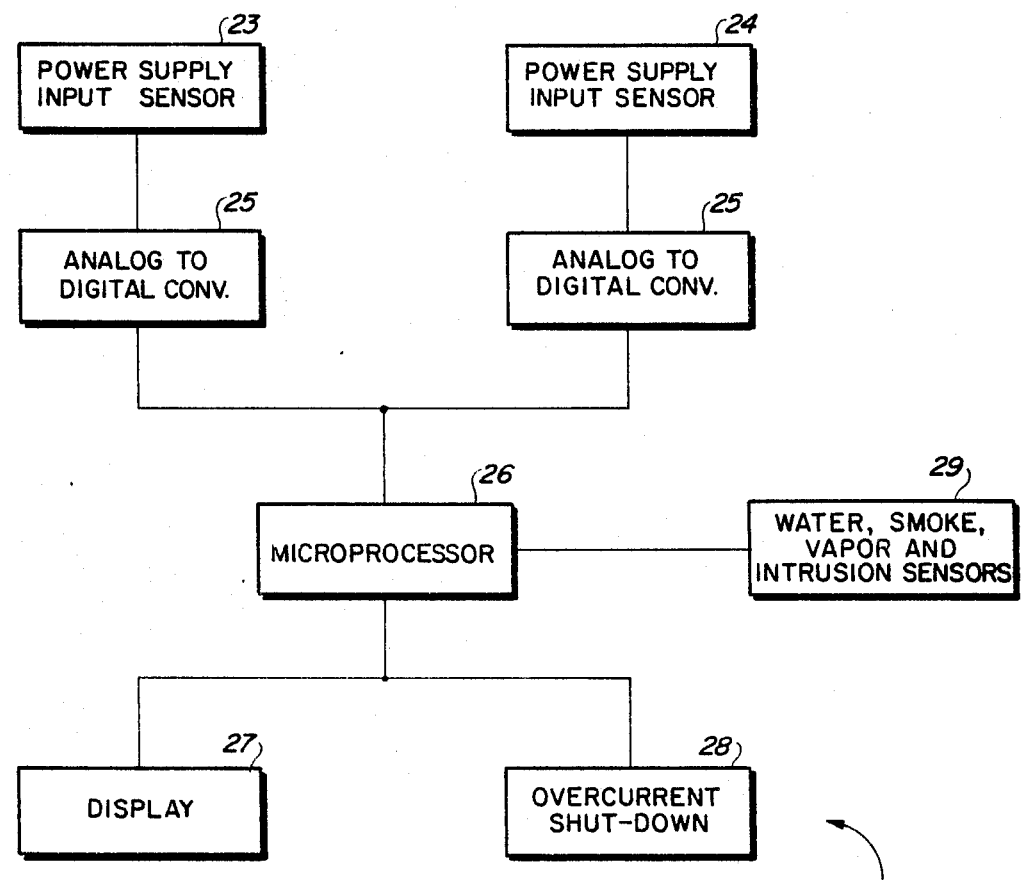
FIG. 1B is a block diagram illustrating the functional organization of the control system illustrated in FIG. 1A.

System 10, as shown functionally in FIG. 1B, employs sensors 23, 24 to monitor input and output currents, respectively, for various power sources such as batteries. Analog to digital (A/D) converters 25 convert the analog sensing signals to digital signals that can be handled by the microprocessor 26. The microprocessor interprets digital signals under control of programs stored in electronic memories (ROMS) incorporated in central unit 11, applies battery and other device algorithms stored in ROMS to supply status indications to the user of the system via display panel 27 and initiates relay operation in over-current shutdown devices 28. The microprocessor 26 also responds to other types of sensors 29 which monitor such things as water, smoke, vapor and vandalism attempts.

Figure 2:
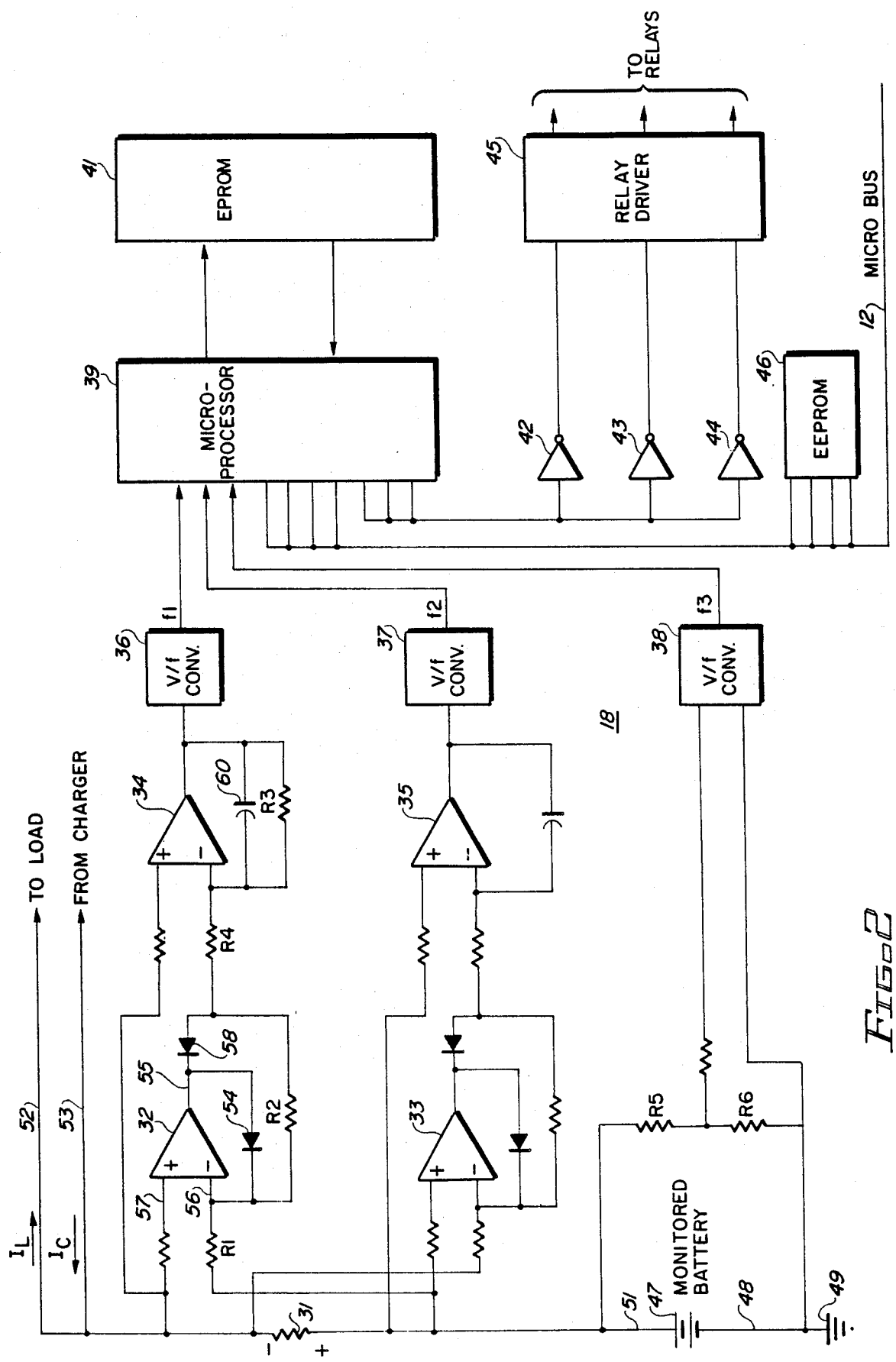
FIG. 2 is a simplified schematic illustrating electronic circuits or elements comprising a remote sensing battery module forming the control system.

The electronic circuits comprising the remote battery sensing module 18, as shown in FIG. 2, incorporate a current sensing resistor (shunt) 31, operational ammplfiers 32-35, voltage to frequency converters 36-38, a microprocessor 39, an electrically programmable read-only memory (EPROM) 41, inverters 42-44, a relay driver 45 and an erasable electrically programmable read-only memory (EEPROM) 46.

In the first implementation of the invention, the following part types were employed:

| Reference Character | Description | Vendor Part No. | Manufacturer |
| --- | --- | --- | --- |
| 32-35 | Operational Amplifier | LM11CN | National Semiconductor Corp. |
| 36-38 | Voltage to Frequency Converter | LM331CN | National Semiconductor Corp. |
| 39 | Microprocessor | P80C31BH | Intel Corp. |
| 41 | EPROM | 87C64 | Intel Corp. |
| 46 | EEPROM | NMC9306 | National Semiconductor Corp. |
| 45 | Relay Driver | ULN2003A | Sprague Electric Co. |

National Semiconductor Corp. Santa Clara, California
Intel Corp. Santa Clara, California
Sprague Electric Co. North Adams, Massachusetts The monitored battery 47 has its negative terminal 48 connected to ground 49. Its positive terminal 51 is connected through sensing resistor 31 to its load via conductor 52, and to a charging means via conductor 53. Load current flowing through resistor 31 produces a voltage drop across resistor 31 of the polarity indicated. A charging current produces a voltage drop of the opposite polarity.

Operational amplifier 32 is connected to respond differently to positive than to negative input signals. A conventional amplifier has a feedback resistor connected directly from its output terminal to its inverting input terminal. Its amplification factor for both positive and negative input signals is then equal to the ratio of the feedback resistor to the input resistor. In the case of amplifier 32, however, a first diode 54 is connected in parallel with feedback resistor R2 from amplifier 32 output terminal 55 to inverting (or "negative") input terminal 56. Diode 54 shorts out feedback resistor R2 for any positive signal at output terminal 55, effectively reducing gain to zero. For a negative excursion at terminal 55 (which results when inverting input terminal 56 is driven positive relative to noninverting (or "positive") input terminal 57), diode 54 is reverse-biased and has no effect, so that gain is equal to R2/R1 as in the conventional amplifier. In its clamping operation, diode 54 has a finite voltage drop (approximately 0.6 volts). To prevent this clamping voltage from being transmitted to the succeeding stage (amplifier 34), the second diode 58 is incorporated. The positive 0.6 volts is blocked by diode 58, the input signal to amplifier 34 being supplied via resistor R2 from input terminal 56 which is at zero volts. Amplifier 32 thus amplifies the positive signal shown across sensing resistor 31 for discharge currents from battery 47, but rejects charging currents which have the opposite polarity.

Amplifier 33 has the same feedback circuit arrangement as amplifier 32, and responds in the same manner as amplifier 32, differentiating between positive and negative signals. Note, however, that its input terminals are connected oppositely from those of amplifier 32 at sensing resistor 31. Amplifier 33 thus amplifies signals produced across resistor 31 by charging currents while rejecting signals produced by discharge or load currents.

Amplifier 34 is connected as an integrator with a capacitor 60 replacing the feedback resistor. Charging currents are typically supplied by a-c sources and are thus pulsed d-c currents, rather than pure d-c. Integration of the pulsed signal produces a filtered d-c signal for transmission to the succeeding stage, i.e., the voltage-to-frequency converter 36. The filtered signal is required at the input to converter 36 to prevent modulation of the output signal from converter 36. Feedback resistor R3 provides a fixed d-c gain for amplifier 34.

Converter 36 is a commercially available printed circuit that delivers a series of pulses at a frequency that is related to the d-c input signal. The signal f1 delivered by converter 36 is thus proportional to the discharge current sensed by amplifier 32 at sensing resistor 31.

Amplifier 35 and converter 37 are identical to amplifier 34 and converter 36, respectively, except that the d-c amplification factor for this channel is reduced by a factor of 0.7 to account for battery losses during charging. The signal f2 delivered by converter 37 is proportional to the charging current sensed by amplifier 33 at resistor 31.

The third voltage-to-frequency converter 38 senses battery voltage through resistive divider R5/R6, and delivers an output signal f3 at a frequency proportional to battery voltage.

The three frequency signals f1, f2 and f3 are delivered to microprocessor 39, which, under the control of a program stored in EPROM 41, interprets the signals by comparison with a conversion table which is stored at the factory in EEPROM 46. By this process, digitally coded numerical values are obtained for charge and/or discharge currents and for battery voltage. The coded values are available for transmission to central control unit 11 via the single-wire micro-bus 12.

EPROM 41 also contains stored algorithms for the prediction of battery life, remaining battery capacity, time needed to complete charge, etc. Recent history of the monitored battery is stored in the random access memory of microprocessor 39. This history includes ampere hours of current drain, accumulated charge, operating temperature, etc., all of which is utilized in conjunction with the algorithms stored in EPROM 41 to determine the expected life and other conditions of the battery. (Battery temperature is obtained by means of temperature sensors and analog-to-digital converters not shown in FIG. 2).

Certain battery conditions warrant disconnection of the battery or connected loads. Relay driver 45 is incorporated in module 18 for such purposes. Driver 45 is capable of controlling three external relays which might be used in the event of battery over-temperature, under-voltage or low capacity. The individual relay drivers are activated by inverters 42–44 which, in turn, are controlled by microprocessor 39.

Two additional relay drivers (not shown in FIG. 2) are incorporated in module 18. One of these relays may be employed to trip an over-current relay; the other to energize a remote alarm.

The central control unit 11 may access remote module 18 at any time by sending via micro-bus 12 a specific code which alerts a specific remote module and initiates a response, the response comprising delivery via the same micro-bus 12 coded information defining the state of the monitored battery 47.

Figure 3:
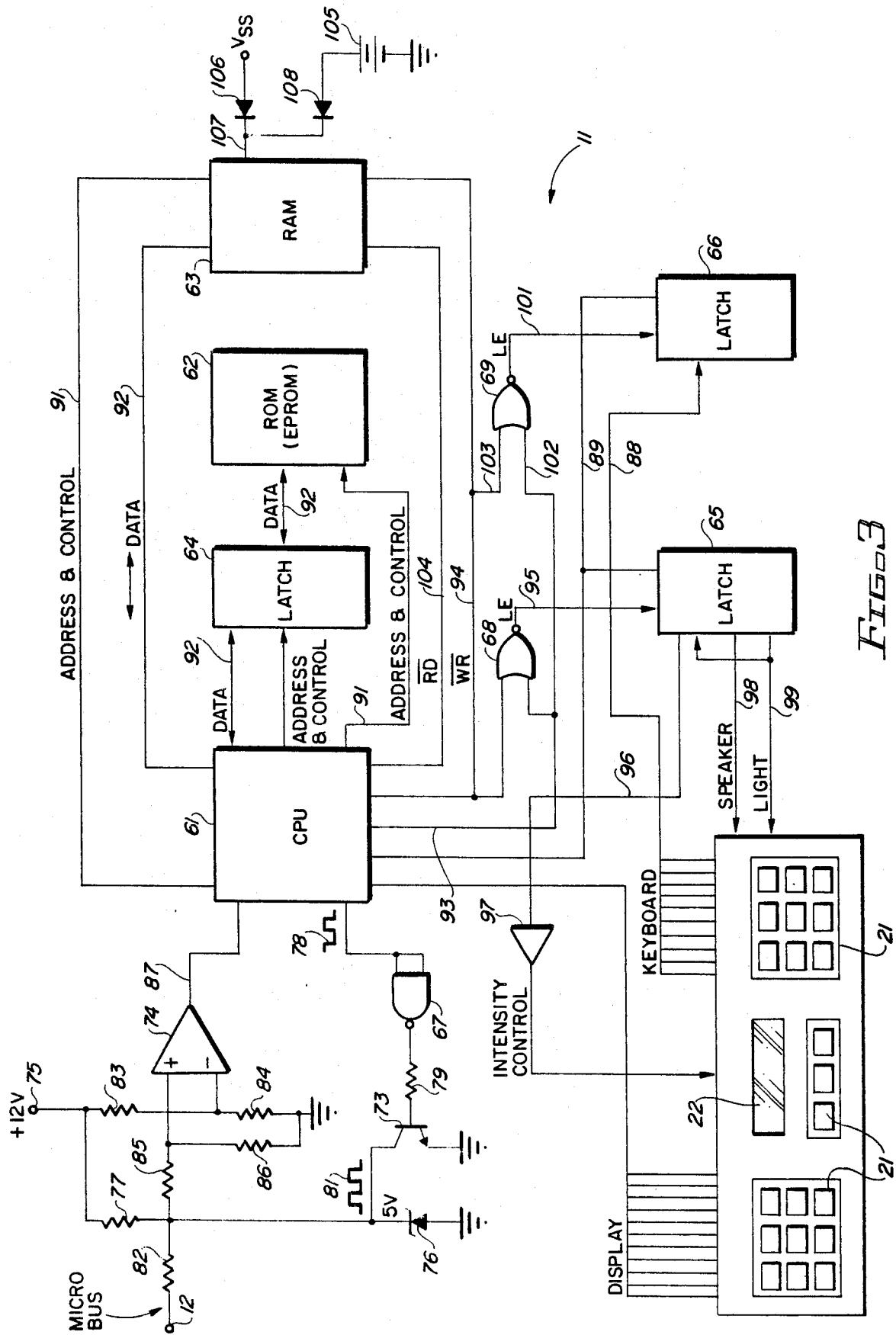
FIG. 3 is a simplified schematic of a central module of the control system.

Central control unit 11, as shown in FIG. 3, comprises a microprocessor or central processor unit (CPU) 61, a read-only memory (ROM) 62, a random-access memory (RAM) 63, buffer registers of latches 64–66 and NOR gates 67–69. These electronic circuits and components are responsive to commands and addresses entered through the keyboard 21 and they provide control and activation of electronic display panel 22.

In the first implementation of the invention, the following part types were employed:

| Reference Character | Description | Vendor Part No. | Manufacturer |
| --- | --- | --- | --- |
| 51 | Microprocessor | P80C31BH | Intel Corp. |
| 54–56 | Latch | NM74HC373N | National Semiconductor Corp. |
| 52 | EPROM | D27C64 | Intel Corp. |
| 53 | RAM | HM6264 | RCA |
| 64 | Comparator | TLC27M4CN | Texas Instruments Inc. |
| 62 | 16 × 2 Dot Matrix Liquid Crystal Display | | Optrex Corp. |

Intel Corp. Santa Clara, California
National Semiconductor Corp. Santa Clara, California
RCA Solid State Division Somerville, New Jersey
Texas Instruments Inc. Dallas, Texas
Optrex Corp. Japan CPU 61 is coupled to micro-bus 12 by NOR gate 67, transistor 73 and comparator 74. A +12 v. d-c source 75 supplies bias current to a five volt zener 76 through a limiting resistor 77. Serially coded signals 78 from CPU 61 drive the base of NPN transistor 73 through NOR gate 67 and base drive resistor 79. Transistor 73 is connected across zener 76 so that as transistor 73 is turned on and off by signal 78, a square wave (alternately +5 v. and zero volt) signal 81 is produced across zener 76, the voltage across zener 76 being collapsed substantially to zero when the transistor is turned on, and clamped to the zener voltage (+5 v.) when the transistor is turned off. Signal 81 passes through series resistor 82 to the micro bus 12 which carries it to the various remote battery modules 18, alternator modules 19 and other remote modules or sensors.

Return signals from the remote modules are entered into CPU 61 via comparator 74. The negative input terminal of the comparator is biased at a threshold level by resistive divider 83, 84 connected to ground from +12 v. source 75. The signal from micro-bus 12 passes through series resistor 82 and a second step-down divider 85, 86 to the positive input terminal of comparator 74. The digital incoming signal alternates between +5 volts and ground as in the case of the transmitted signal, so that the zener voltage is unclamped during the low level of the input signal. The low signal level drives the positive input terminal of comparator 74 negative with respect to the negative input terminal, causing the output terminal 87 to switch low also. The signal is thus delivered to the CPU as received for decoding and processing.

Operation of the central unit is in accordance with a control program that is stored in read-only memory (ROM) 62. The control program is a series of commands stored in successive memory cells. A counter in CPU 61 steps through the commands in order, entering at a given time into a particular sequence as directed by coded commands entered at keyboard 21, or as directed automatically by the stored control program of ROM 62. Every four seconds, for example, the CPU interrogates each remote module requesting data on the monitored battery, alternator or other device. The remote module responds immediately, returning voltage signal, current signals, etc.

Operator access, as in the case of the typical personal computer, is via the keyboard 21. Signals from keyboard 21 pass through signal lines 88 to latches (registers) 65 and 66 which are enabled by gates 68 and 69 as controlled by CPU 61. Data lines 89 carry signals from latches 65, 66 to RAM 63 via the CPU. Signals may comprise entry data related to elements of the monitored electrical system or commands calling for some kind of response from the central unit. In either case, the entry at the keyboard directs the CPU to enter the control program of ROM 62 at the appropriate point, so that the desired action is taken.

Communication between CPU 61 and ROM 62 is facilitated by latch 64 which serves as a buffer, holding data from ROM 62 during the processing of the information by the CPU. Address and control lines 91 and data lines 92 permit CPU 61 to interface with ROM 62 and RAM 63.

Certain control functions affecting central unit operational features, including control of screen 22 intensity, an audible alarm and a viewing light, are initiated at the keyboard with a responsive action required from the CPU. In such cases, commands from the CPU are routed through latch 65. To write data into latch 65, the CPU first enables latch 65 to receive the coded command from the CPU. Enable line 93 and write line ($\overline{WR}$) 94 are both set to zero. The output terminal 95 of NOR gate 68 is driven to the "high" level (output of a NOR gate is high when neither of its inputs are high), the "high" level serving as a latch enable (LE) signal for latch 65. Data thus entered into latch 65 are displatched via line 96 and buffer 97 to effect the desired control of screen intensity, via line 98 to energize the speaker, or via line 99 to energize the light.

Latch 66 is enabled by gate 69 to perform its function of reading keyboard data. Again, to obtain a latch enable signal at the output terminal 101 of NOR gate 69, both its input terminals 102 and 103 must be set low. Thus, CPU 61 must again set enable line 93 to a low level together with "read" ($\overline{RD}$) line 104.

It will be noted that the same $\overline{WR}$ and $\overline{RD}$ lines, 104 and 94, respectively, are employed in the execution of read and write operations of RAM 63.

Data or control programs stored in EPROM 41 of remote module 18 as well as the control program stored in ROM 62 of central unit 11 are nonvolatile, i.e., they will not be lost if power to the remote module or to the central unit is interrupted. In the case of RAM 63, however, the integrity of stored information is dependent upon continuous power being supplied to the RAM. To insure such power continuity, a backup battery 105 is provided as a redundant power source. The normal power source, $V_{SS}$ is supplied through a first diode 106 to RAM supply terminal 107. Battery 105 has its positive terminal connected to supply terminal 107 through a second diode 108. Source $V_{SS}$ is normally at a higher potential than battery 105, so that current flow to RAM 63 is ordinarily from $V_{SS}$ through diode 106. In the event of a failure or collapse of source $V_{SS}$, battery 105 takes over, supplying current through diode 108. Battery backup, provided in this manner, insures the integrity of data stored in RAM 63 regarding initial and operating histories of the various batteries and other electrical components being monitored by the system 10.

Because the control program stored in ROM 62 of central unit 11 may be tailored to match the specific requirements of a given electrical system that is to be monitored, a wide range of capabilities is available in system 10. In its first implementation, which was directed primarily toward the monitoring of batteries in a marine power system, the operator may access the system 10 at any time by means of the keyboard to learn the condition of each element of the system. To select the desired element, the operator first pushes a button marked "battery". A second numerically marked button is then pressed to select a specific battery (battery #1, #2, etc.). Complete status of the selected battery is then presented to the user in the form of a visual display, the information presented including the following:

Current drain
Battery voltage
Remaining ampere hours
Charging time
Alarm status
Time until depleted
Temperature
Instantaneous drain
Battery capacity Different categories of information are called for by selecting different mode keys at the keyboard. In the event of an emergency at sea, such as engine failure, the operator may readily assess the condition of the electrical energy storage system to learn what must be done to conserve battery capacity for critical uses such as energizing distress lights, bilge pumps, etc.

A versatile and effective monitoring and control system is thus provided in accordance with the stated objects of the invention, and although but a single embodiment of the invention has been illustrated and described, it will be apparent to those skilled in the art that various changes and modifications may be made therein without departing from the spirit of the invention or from the scope of the appended claims.

What is claimed is:

1. A device for monitoring charging and discharging currents of a storage battery together with its controls, said device comprising:
    a current sensing resistor (shunt) adapted to be connnected in series with a battery, the voltage and its polarity across said resistor being proportional to charging and discharging current through the battery and the direction of its flow,
    a first amplifier means responsive only to signals across said resistor indicating discharge current flow through the battery for providing a first amplified voltage,
    a second amplifier means responsive only to signals across said resistor indicating charging current flow through the battery for providing a second amplified voltage,
    first and second voltage to frequency converters one for each of said first and said second amplifier means, each providing a train of pulses at a frequency proportional to the value of the first and second amplified voltage,
    a microprocessor connected to receive the train of pulses from each of the first and second frequency converters and embodying a stored program for interpreting the first and second train of pulses and generating signals responsive thereto, and
    relay means connected to said microprocessor for responding to said generated signals.

2. The device set forth in claim 1 in further combination with:
    an electrically programmable read-only memory comprising a conversion table,
    said microprocessor comprising means for comparing said train of pulses received with said conversion table to provide digitally coded numerical values representative of the charging and discharging currents through the battery, and
    display means for visually responding to said numerical values.

3. A device for monitoring charging and discharging currents of a storage battery together with its controls, said device comprising:
    a current sensing resistor adapted to be connected in series with a battery, the voltage and its polarity across said resistor being proportional to charging and discharging current through the battery and the direction of its flow,
    a first amplifier means responsive only to signals across said resistor indicating discharge current flow through the battery for providing a first amplified voltage,
    a second amplifier means responsive only to signals across said resistor indicating charging current flow through the battery for providing a second amplified voltage,
    first and second voltage to frequency converters one for each of said first and said second amplifier means, each providing a train of pulses at a frequency proportional to the value of the first and the second amplified voltage,
    a microprocessor connected to receive the train of pulses from each of the first and second frequency converters and embodying a stored program for interpreting the first and second train of pulses and generating signals responsive thereto,
    an electrically programmable read-only memory comprising a conversion table, said microprocessor comprising means for comparing said train of pulses received with said conversion table to provide digitally coded numerical values representative of the charging and discharging currents through the battery, and display means for visually responding to said numerical values.

4. A device for monitoring charging and discharging currents of a storage battery together with its controls, said device comprising:

a current sensing resistor adapted to be connected in series with a battery, the voltage and its polarity across said resistor being proportional to charging and discharging current through the battery and the direction of its flow, a first amplifier means responsive only to signals across said resistor indicating discharge current flow through the battery for providing a first amplified voltage, a second amplifier means responsive only to signals across said resistor indicating charging current flow through the battery for providing a second amplified voltage, first and second voltage to frequency converters one for each of said first and said second amplifier means, each providing a train of pulses at a frequency proportional to the value of the first and the second amplified voltage, a resistive divider for connection across the battery, a third voltage to frequency converter responsive to battery voltage across said divider for providing a train of pulses at a frequency proportional to voltage across the battery, a microprocessor connected to receive the train of pulses from each of the first, second and third frequency converters and embodying a stored program for interpreting the first, second and third train of pulses and generating signals responsive thereto, relay means connected to said microprocessor for responding to said generated signals, and display means for visually responding to said generated signals.

5. The device set forth in claim 4 wherein:

said microprocessor comprising a conversion table for comparing the train of pulses received and providing in response thereto digitally coded numerical values representative of the charge and discharge currents flowing through said resistor.

6. The device set forth in claim 4 wherein:

said microprocessor embodying said stored programs interprets the train of pulses received to provide status indications to the user of the device and over-current signals to said relay means.

7. A device for monitoring charging and discharging currents of a storage battery means together with its controls, said device comprising:

a current sensing resistor (shunt) means adapted to be connected in series with a storage battery means, the voltage and its polarity across said resistor means being proportional to charging and discharging current through the battery means and the direction of its flow, a first amplifier means responsive only to signals across said resistor means to provide a first amplified voltage indicating discharge current flow through the battery means, a second amplifier means responsive only to signals across said resistor means to provide a second amplified voltage indicating charging current flow through the battery means, first and second voltage to frequency converters one for each of said first and said second amplifier means, each providing a train of pulses at a frequency proportional to the value of the first and the second amplified voltage, a resistive divider for connection across the battery means, a third voltage to frequency converter responsive to battery voltage across said divider for providing a train of pulses at a frequency proportional to voltage across the battery means, a microprocessor connected to receive the train of pulses from each of the first, second and third frequency converters and embodying a stored program for interpreting the first, second and third train of pulses and generating signals responsive thereto, relay means connected to said microprocessor for responding to said generated signals, and display means for visually responding to said generated signals.

* * * * *